United States Patent
Oishi

(10) Patent No.: US 9,450,549 B2
(45) Date of Patent: Sep. 20, 2016

(54) DIFFERENTIAL AMPLIFICATION CIRCUIT

(71) Applicant: FUJITSU LIMITED, Kawasaki-shi, Kanagawa (JP)

(72) Inventor: Kazuaki Oishi, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 4 days.

(21) Appl. No.: 14/631,582

(22) Filed: Feb. 25, 2015

(65) Prior Publication Data

US 2015/0341004 A1 Nov. 26, 2015

(30) Foreign Application Priority Data

May 20, 2014 (JP) ................................. 2014-104659

(51) Int. Cl.
*H03F 3/45* (2006.01)
*H03F 1/02* (2006.01)

(52) U.S. Cl.
CPC ......... *H03F 3/45179* (2013.01); *H03F 1/0211* (2013.01); *H03F 1/0272* (2013.01); *H03F 3/45085* (2013.01); *H03F 3/45197* (2013.01); *H03F 3/45659* (2013.01); *H03F 3/45748* (2013.01); *H03F 2200/144* (2013.01); *H03F 2203/45118* (2013.01); *H03F 2203/45418* (2013.01); *H03F 2203/45434* (2013.01); *H03F 2203/45481* (2013.01); *H03F 2203/45512* (2013.01); *H03F 2203/45526* (2013.01); *H03F 2203/45528* (2013.01); *H03F 2203/45631* (2013.01); *H03F 2203/45694* (2013.01); *H03F 2203/45702* (2013.01)

(58) Field of Classification Search
CPC ... H03F 3/45; H03F 3/45179; H03F 3/45744
USPC .................................. 330/253, 257, 258, 292
See application file for complete search history.

(56) References Cited

U.S. PATENT DOCUMENTS 6,316,998 B1* 11/2001 Oikawa ................... H03F 1/086
 330/255
2010/0244961 A1* 9/2010 Saigusa ............... H03F 3/45183
 330/260

FOREIGN PATENT DOCUMENTS

JP 2012-100224 A 5/2012

* cited by examiner

*Primary Examiner* — Steven J Mottola
(74) *Attorney, Agent, or Firm* — Arent Fox LLP

(57) ABSTRACT

A differential amplification circuit includes: a first input node; a second input node; a first output node; a second output node; a first transistor having a gate coupled to the first input node and a source coupled to a first node; a second transistor having a gate coupled to the second input node; a third transistor having a drain coupled to a drain of the first transistor; a fourth transistor having a gate coupled to a gate of the third transistor; a first resistor; a second resistor; a fifth transistor having a gate coupled to the drain of the first transistor; a sixth transistor having a gate coupled to the drain of the second transistor; a seventh transistor having a source coupled to the first node; an eighth transistor having a gate coupled to a gate of the seventh transistor; a third resistor; and a fourth resistor.

11 Claims, 7 Drawing Sheets

DIFFERENTIAL AMPLIFICATION CIRCUIT

CROSS-REFERENCE TO RELATED APPLICATION

This application is based upon and claims the benefit of priority from the prior Japanese Patent Application No. 2014-104659 filed on May 20, 2014, the entire contents of which are incorporated herein by reference.

FIELD

The embodiments discussed herein are related to a differential amplification circuit.

BACKGROUND

A broadband amplifier includes a differential pair of a first and a second MOS transistors which performs a voltage-current conversion on a differential input signal input to a gate thereof to output a differential output signal.

A related technique is disclosed in, for example, Japanese Laid-Open Patent Publication No. 2012-100224.

SUMMARY

A differential amplification circuit includes: a first differential input node; a second differential input node; a first differential output node; a second differential output node; a first transistor having a gate coupled to the first differential input node and a source coupled to a first potential node; a second transistor having a gate coupled to the second differential input node and a source coupled to the first potential node; a third transistor having a drain coupled to a drain of the first transistor and a source coupled to a second potential node; a fourth transistor having a gate coupled to a gate of the third transistor, a drain coupled to a drain of the second transistor, and a source coupled to the second potential node; a first resistor coupled between the drain and gate of the third transistor; a second resistor coupled between the drain and the gate of the fourth transistor; a fifth transistor having a gate coupled to the drain of the first transistor, a source coupled to the second potential node, and a drain coupled to the first differential output node; a sixth transistor having a gate coupled to the drain of the second transistor, a source coupled to the second potential node, and a drain coupled to the second differential output node; a seventh transistor having a source coupled to the first potential node and a drain coupled to the first differential output node; an eighth transistor having a gate coupled to a gate of the seventh transistor, a source coupled to the first potential node, and a drain coupled to the second differential output node; a third resistor coupled between the drain and gate of the seventh transistor; and a fourth resistor coupled between the drain and gate of the eighth transistor.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In a broadband amplifier, a current source that includes a third and fourth MOS transistors has polarities opposite to those of a first and second MOS transistors, and the gates and drains of the third and fourth MOS transistors are coupled through a resistor circuit respectively, thereby acting as a load current source to a differential pair of the first and second MOS transistors. A first bias circuit sets a bias to the inputs of the first and second MOS transistors. Each of first and second capacitive elements is inserted corresponding to a path over which differential input signals are supplied to the third and fourth MOS transistors, respectively. The first bias circuit is configured to make the drain currents of the first and second MOS transistors flow and to obtain a bias value which causes an absolute value of a component obtained by differentiating the drain currents of the first and second MOS transistors twice with a gate voltage to be minimized. The size of the third and fourth MOS transistors is set to a predetermined value which takes an operating point at which a current is generated where a main component is a secondary distortion component.

A differential amplification circuit capable of being operated with a low power supply voltage is required in order to achieve low power consumption of the differential amplification circuit. In the differential amplification circuit, since a common-mode feedback circuit for performing a feedback control on a common mode voltage of the differential signal is provided, an area occupied by the differential amplification circuit may become larger.

Figure 1B:
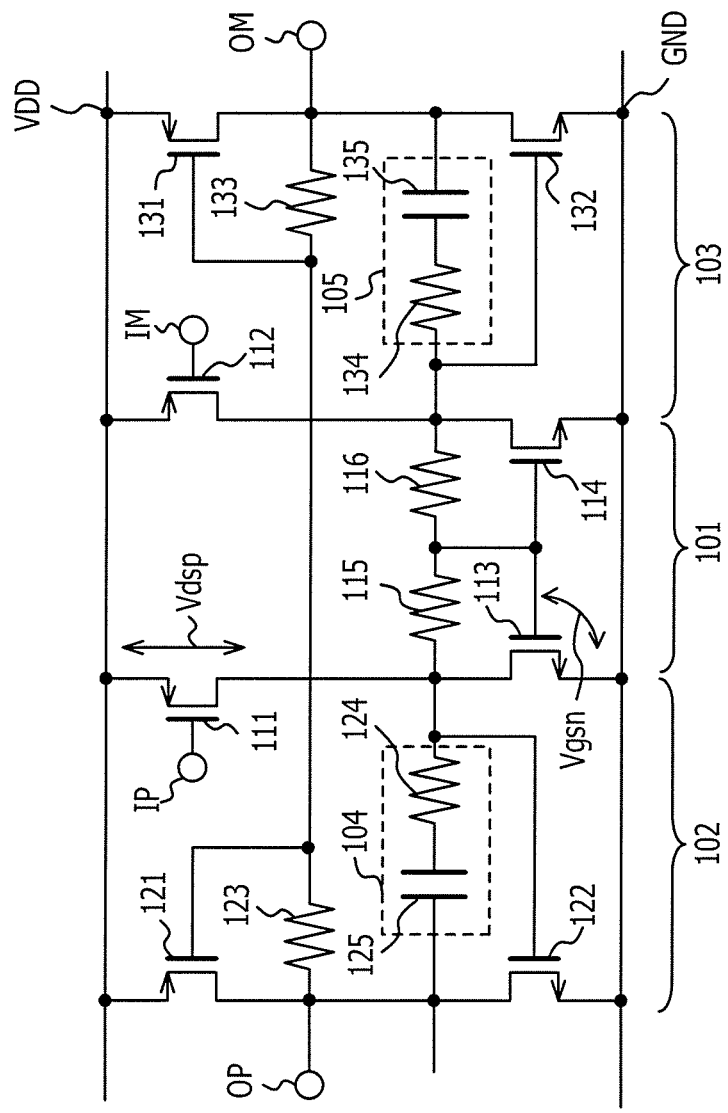
FIGS. 1A and 1B illustrate examples of a differential amplification circuit.
Figure 1A:
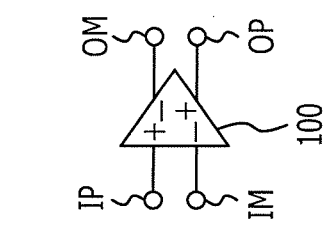

FIGS. 1A and 1B illustrate examples of a differential amplification circuit. A differential amplification circuit 100 is a fully differential operational amplifier circuit and includes an input stage 101 and output stages 102 and 103. Differential signals that are mutually reversed in phase are input to a first differential input node IP and a second differential input node IM. The differential amplification circuit 100 amplifies the differential signal input to the first differential input node IP and the second differential input node IM and outputs an amplified differential signal from a first differential output node OP and a second differential output node OM. The first differential output node OP and the second differential output node OM output the differential signals that are mutually reversed in phase with each other. Hereinafter, a field effect transistor may be referred to as a transistor.

A first transistor 111 of the input stage 101 may be a p-channel transistor. A gate of the first transistor 111 is coupled to the first differential input node IP and a source of the first transistor 111 is coupled to a first potential node VDD. The first potential node VDD may be a positive power supply potential node. A second transistor 112 of the input stage 101 may be a p-channel transistor. A gate of the second transistor 112 is coupled to the second differential input node IM and a source of the second transistor 112 is coupled to the first potential node VDD. A third transistor 113 of the input stage 101 may be an n-channel transistor. A drain of the third transistor 113 is coupled to a drain of the first transistor 111 and a source of the third transistor 113 is coupled to a second potential node GND. The second potential node GND may be a ground potential node. A fourth transistor 114 of the input stage 101 may be an n-channel transistor. A gate of a fourth transistor 114 is coupled to a gate of the third transistor 113, a drain of the fourth transistor 114 is coupled to a drain of the second transistor 112, and a source of the fourth transistor 114 is coupled to the second potential node GND. A first resistor 115 is coupled between the drain and gate of the third transistor 113. A second resistor 116 is coupled between the drain and gate of the fourth transistor 114.

A fifth transistor 122 of the output stages 102 and 103 may be an n-channel transistor. A gate of the fifth transistor 122 is coupled to the drain of the first transistor 111, a source of the fifth transistor 122 is coupled to the second potential node GND, and a drain of the fifth transistor 122 is coupled to the first differential output node OP. A sixth transistor 132 of the output stages 102 and 103 may be an n-channel transistor. A gate of the sixth transistor 132 is coupled to the drain of the second transistor 112, a source of the sixth transistor 132 is coupled to the second potential node GND, and a drain of the sixth transistor 132 is coupled to the second differential output node OM. A first phase compensation circuit 104 is a series coupled circuit with a resistor 124 and a capacitor 125 coupled in series, and is coupled between the drain and gate of the fifth transistor 122. A second phase compensation circuit 105 is a series coupled circuit with a resistor 134 and a capacitor 135 coupled in series, and is coupled between the drain and gate of the sixth transistor 132. A seventh transistor 121 of the output stages 102 and 103 may be a p-channel transistor. A source and drain of the seventh transistor 121 are coupled to the first potential node VDD and first differential output node OP, respectively. An eighth transistor 131 of the output stages 102 and 103 may be a p-channel transistor. A gate of the eighth transistor 131 is coupled to the gate of the seventh transistor 121, a source of the eighth transistor 131 is coupled to the first potential node VDD, and a drain of the eighth transistor 131 is coupled to the second differential output node OM. A third resistor 123 is coupled between the drain and gate of the seventh transistor 121. A fourth resistor 133 is coupled between the drain and gate of the eighth transistor 131.

The p-channel transistor and the n-channel transistor may be replaced with each other. In this case, potentials of the first potential node VDD and the second potential node GND are also set to be opposite to each other. The transistors 111, 112, 121 and 131 may have the same polarity. The polarities of the transistors 113, 114, 122 and 132 are the same as each other and opposite to the polarities of the transistors 111, 112, 121 and 131.

In the input stage 101, the source-grounded transistors 111 and 112 are source-grounded amplifiers. The transistors 113 and 114 are load circuits and are undergone self-controlled feedback by the resistors 115 and 116, respectively.

In the output stages 102 and 103, the source-grounded transistors 122 and 132 are source-grounded amplifiers that receive an output voltage of the input stage 101 as an input. The transistors 121 and 131 are load circuits and are undergone self-controlled feedback by the resistors 123 and 133, respectively. Phase compensation circuits 104 and 105 are coupled between input and output terminals of the transistors 122 and 132, respectively. The phase compensation circuits 104 and 105 may reduce or prevent an oscillation of the differential amplification circuit 100. Each of the phase compensation circuits 104 and 105 may have only the capacitors 125 and 135 in place of the resistors 124 and 134, respectively.

A power supply voltage may be a voltage between the first potential node VDD and the second potential node GND and represented by, for example, the following equation. Vgsn is a voltage between the gate and source of the n-channel transistor 113 and may be, for example, approximately 0.4 V. Vdsp is a voltage between the drain and source of the p-channel transistor 111 and may be, for example, approximately −0.1 V. Vm is a margin for manufacturing and/or temperature variations and may be, for example, approximately 0.2 V.

$$Vgsn - Vdsp + Vm = 0.4\text{ V} + 0.1\text{ V} + 0.2\text{ V}$$
$$= 0.7\text{ V}$$

Figure 2A:
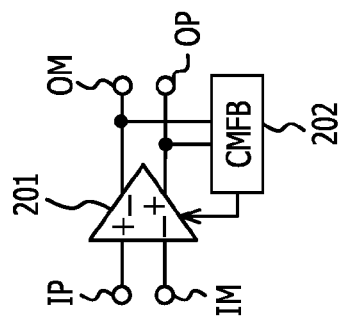
FIGS. 2A and 2B are circuit diagrams illustrating another example of a differential amplification circuit.
Figure 2B:
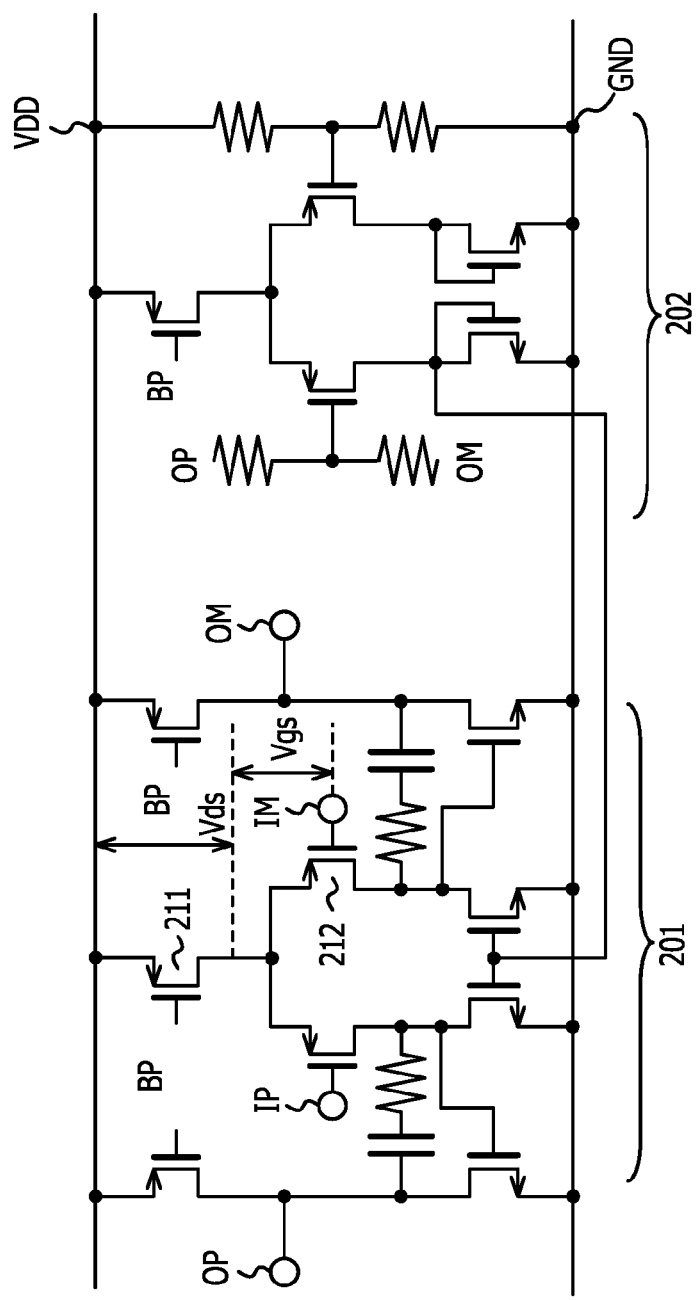

FIGS. 2A and 2B illustrate examples of another differential amplification circuit. The differential amplification circuit includes an amplification circuit 201 and a common-mode feedback (CMFB) circuit 202. The amplification circuit 201 amplifies the differential signal input to the differential input nodes IP and IM and outputs the amplified differential signal from the differential output nodes OP and OM. A p-channel transistor 211 is a current source. A voltage BP is a bias voltage. The common-mode feedback circuit 202 monitors a common mode voltage of the differential signals of the differential output nodes OP and OM and the common mode voltage is feedback to the amplification circuit 201 to be controlled such that the common mode voltage is converged to a certain voltage. The common mode voltage may be an average DC voltage of, for example, the differential signals of the differential output nodes OP and OM of FIG. 7C, and may be represented by (OP+OM)/2. The common mode voltage in FIG. 7C may be a DC voltage of 500 mV.

The power supply voltage may be a voltage between the first potential node VDD and a second potential node GND, and may be represented by the following equation. Vds is a voltage between a drain and source of a p-channel transistor 211, and may be, for example, approximately 0.1 V. Vgs is a voltage between a gate and source of a p-channel transistor 212, and may be, for example, approximately −0.4 V. Vdd is a potential of the first potential node VDD. Vdd/2 is a voltage applied to between the gate of the p-channel transistor 212 and the second potential node GND, and may be, for example, substantially the same as the common mode voltage described above and may be, for example, approximately 0.5 V. Vm is the margin for manufacturing and/or temperature variations and may be, for example, approximately 0.2 V.

$$-Vdsp - Vgs + Vdd/2 + Vm = 0.1\text{ V} + 0.4\text{ V} + 0.5\text{ V} + 0.2\text{ V}$$
$$= 1.2\text{ V}$$

The power supply voltage of the differential amplification circuit illustrated in FIG. 2B becomes 1.2 V. In the differential amplification circuit 100 illustrated in FIG. 1B, since the transistor 211 of the current source illustrated in FIG. 2B may become unnecessary, the power supply voltage is lowered to 0.7 V. For example, since the power supply voltage of the differential amplification circuit 100 illustrated in FIG. 1B is represented by Vgsn−Vdsp+Vm, the power supply voltage of the differential amplification circuit 100 illustrated in FIG. 1B is lowered. The differential amplification circuit 100 illustrated in FIG. 1B is allowed to consume less power than the differential amplification circuit illustrated in FIG. 2B. For example, the differential amplification circuit 100 illustrated in FIG. 1B may not have the common-mode feedback circuit 202 illustrated in FIGS. 2A and 2B.

Figure 3B:
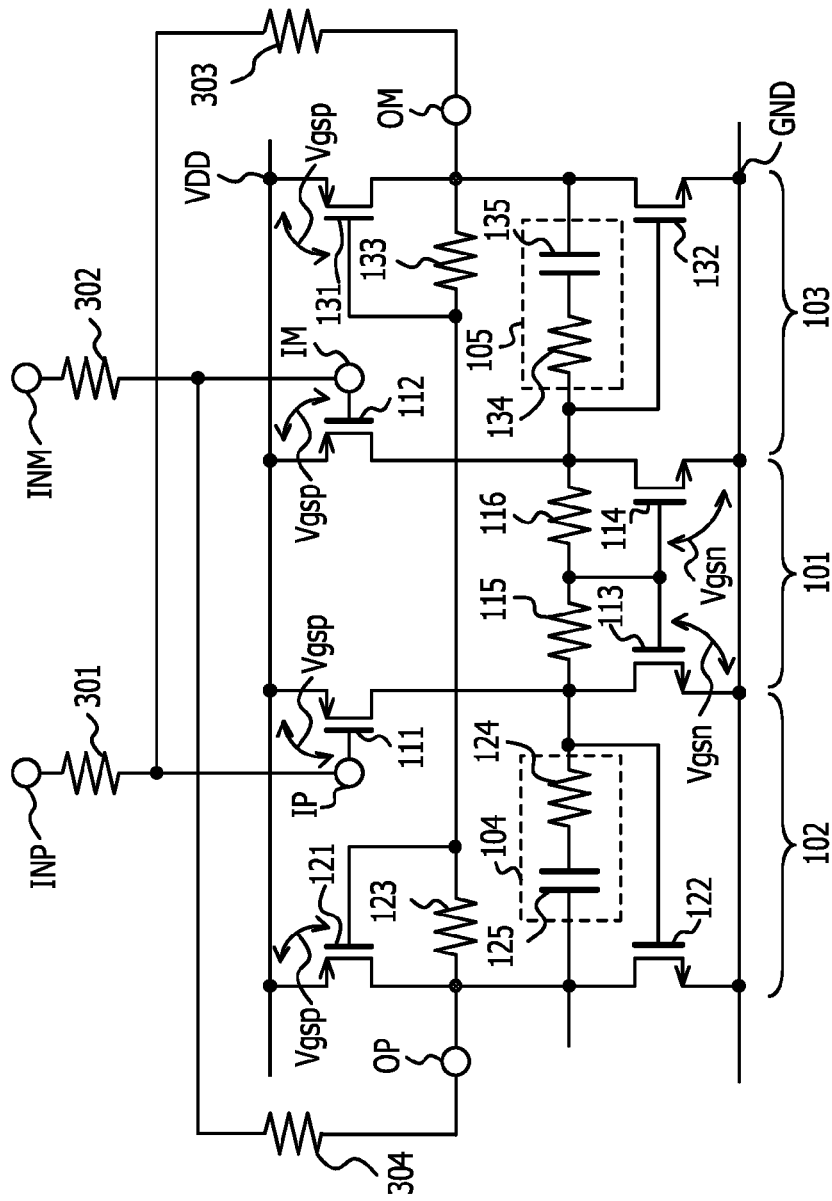
FIGS. 3A and 3B are circuit diagrams illustrating still another example of a differential amplification circuit.
Figure 3A:
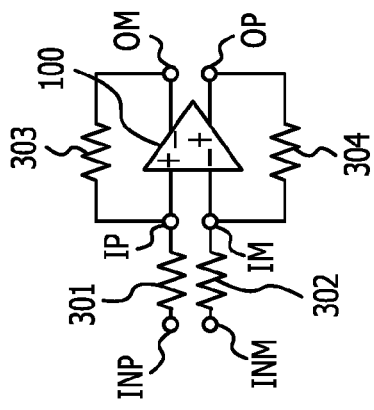

FIGS. 3A and 3B illustrate examples of another differential amplification circuit. Descriptions will be made on a difference between the differential amplification circuit illustrated in FIGS. 3A and 3B and the differential amplification circuit illustrated in FIGS. 1A and 1B, and descriptions on the matters that are substantially the same or similar between the differential amplification circuits illustrated in FIGS. 3A and 3B and FIGS. 1A and 1B may be omitted or reduced. The differential amplification circuit 100 is coupled with resistors 301 to 304. A fifth resistor 301 is coupled between the first differential input node IP and a third differential input node INP. A sixth resistor 302 is coupled between the second differential input node IM and a fourth differential input node INM. The resistor 303 is a first feedback element and is coupled between the first differential input node IP and the second differential output node OM. The resistor 304 is a second feedback element and is coupled between the second differential input node IM and the first differential output node OP. For example, when a resistance value of the resistors 301 and 302 is R1 and a resistance value of the resistors 303 and 304 is R2, a gain of the differential amplification circuit 100 becomes R2/R1. The differential amplification circuit 100 amplifies the differential signal input to the differential input nodes INP and INM with the gain of R2/R1 and outputs the amplified differential signal from the differential output nodes OP and OM.

When a voltage between the gate and source of each of the p-channel transistors 111 and 112 is Vgsp, the common mode voltage of the differential signals to be input to the differential input nodes INP and INM is set to Vdd+Vgsp. Vdd is a potential of the first potential node VDD. For example, the common mode voltage of differential signals inputted to the differential input nodes INP and IP and differential input node INM and IM may be substantially the same voltage as the voltage Vgsp between the gates and sources of the first transistor 111 and the second transistor 112 with respect to the first potential node VDD.

When the differential signal is input to the differential input nodes INP and INM, a voltage between the gate and source of each of the transistors 111 and 112 becomes Vgsp and a drain current Id flows in each of the transistors 111 and 112. A drain current Id flows also in the transistors 113 and 114. The voltage between the gates and sources of the transistors 113 and 114 may be Vgsn. The voltage between the gates and sources of the transistors 122 and 132 may also be Vgsn. The drain current Id flows in each of the transistors 122 and 132. The drain current Id flows also in the transistors 121 and 131. The voltage between the gate and source of each of the transistors 121 and 131 becomes Vgsp. The common mode voltage of the differential signals is converged to INP=INM=IP=IM=OP=OM=Vgsp with respect to the first potential node VDD. Therefore, in the differential amplification circuit illustrated in FIG. 1B and the second differential amplification circuit illustrated in FIG. 3B, the common-mode feedback circuit 202 illustrated in FIGS. 2A and 2B may not be disposed and an area for the differential amplification circuit and an area for the second differential amplification circuit may be reduced.

The differential amplification circuit illustrated in FIGS. 1B and 3B may consume less power and have a smaller area than the differential amplification circuit illustrated in FIG. 2B.

Figure 7A:
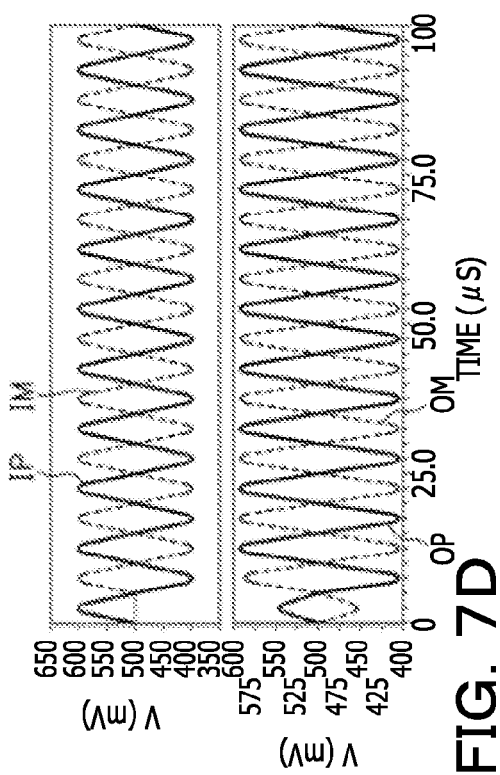
FIGS. 7A to 7D are diagrams illustrating examples of simulation results.
Figure 7B:
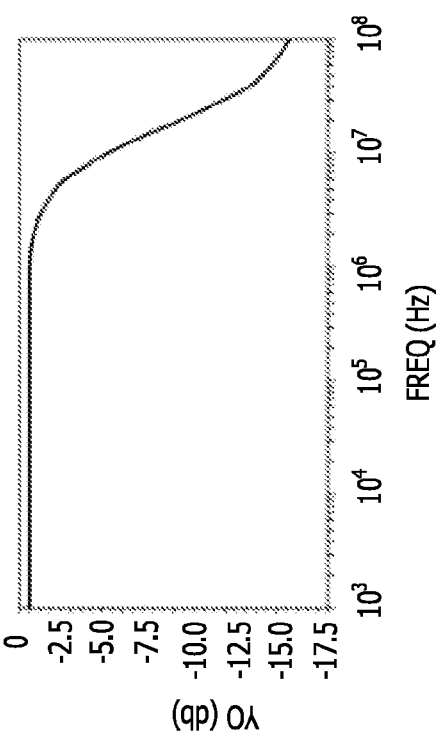
Figure 7C:
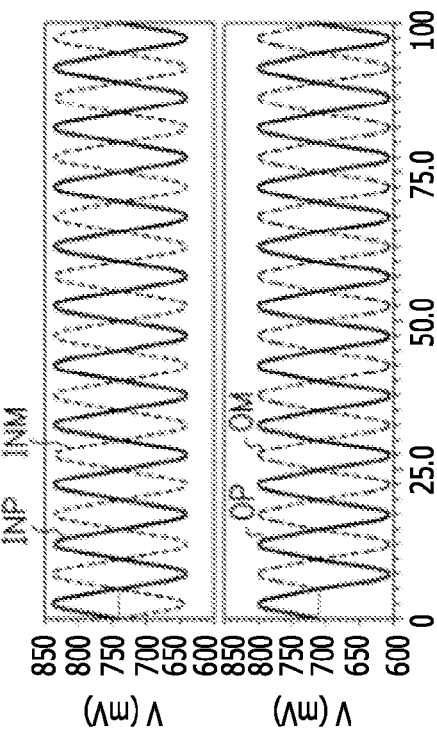

FIGS. 7A to 7D illustrate examples of simulation results. In FIG. 7A, simulation waveform charts of the differential signal of the differential input nodes INP and INM and the differential signal of the differential output nodes OP and OM of the differential amplification circuit of FIG. 3B are illustrated. In FIG. 7C, the simulation waveform charts of the differential signal of the differential input nodes IP and IM and the differential signal of the differential output nodes OP and OM of the differential amplification circuit calibrated by coupling the same resistors as 301, 302, 303, and 304 of the differential amplification circuits of FIGS. 3A and 3B to the differential amplification circuit of FIG. 2B are illustrated. The differential amplification circuit of FIG. 3B may have substantially the same input and output waveforms as those of the differential amplification circuit of FIG. 2B.

Figure 7D:
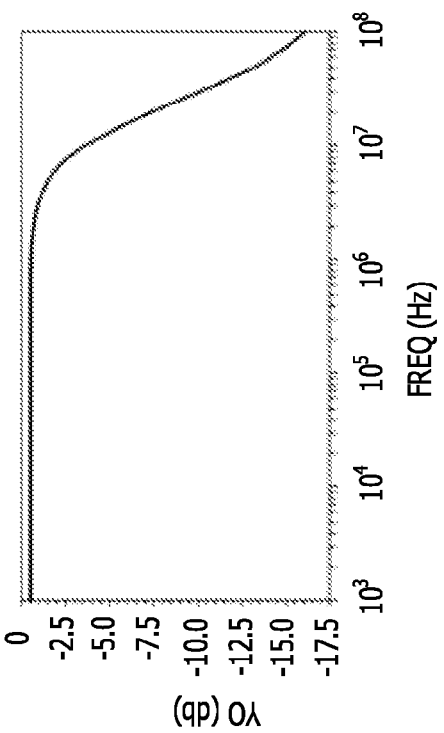

In FIG. 7B, the simulation result of the frequency characteristics of the gain of the differential amplification circuit of FIG. 3B is illustrated. FIG. 7D illustrates the simulation result of the frequency characteristics of the gain of the differential amplification circuit calibrated by coupling the same resistors as 301, 302, 303, and 304 of the differential amplification circuits of FIGS. 3A and 3B to the differential amplification circuit of FIG. 2B. The differential amplification circuit of FIG. 3B may have substantially the same frequency characteristics of the gain as that of the differential amplification circuit of FIG. 2B.

The differential amplification circuit of FIG. 3B may have a lower power supply voltage and a smaller area than those of the differential amplification circuit of FIG. 2B, and may maintain an equivalent characteristic.

Figure 4:
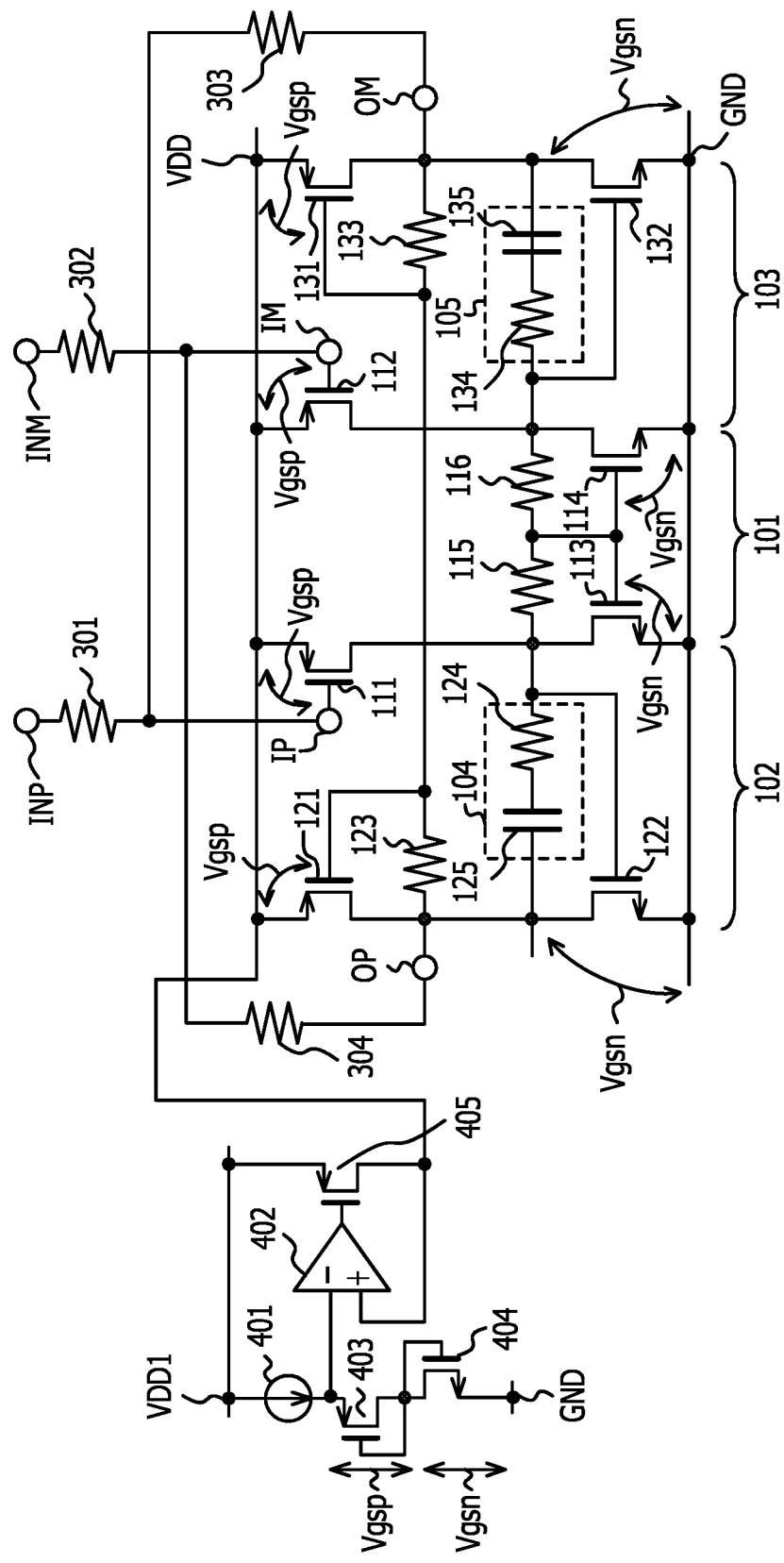
FIG. 4 is a circuit diagram illustrating yet another example of a differential amplification circuit.

FIG. 4 illustrates an example of another differential amplification circuit. Descriptions will be made on a difference between the differential amplification circuit illustrated in FIG. 4 and the differential amplification circuit illustrated in FIGS. 2A and 2B, and descriptions on the matters that are substantially the same or similar between the differential amplification circuits illustrated in FIG. 4 and FIGS. 2A and 2B may be omitted or reduced. In the differential amplification circuit of FIG. 4, a current source 401, an operational amplifier 402 and transistors 403 to 405 are added to the differential amplification circuit of FIG. 3B. The operational amplifier 402 and transistor 405 may correspond to a first voltage regulator.

The ninth transistor 403 may be a p-channel transistor. A gate and drain of the ninth transistor 403 are coupled with each other and a source of the ninth transistor 403 is coupled to a potential node VDD1 through the current source 401. A tenth transistor 404 may be an n-channel transistor. A gate and drain of the tenth transistor 404 are coupled to the drain of the ninth transistor 403 and a source of the tenth transistor 404 is coupled to the second potential node GND. A voltage between the drain and source of the ninth transistor 403 may be substantially the same as the voltage Vgsp between the gate and source of the ninth transistor 403. A voltage between the drain and source of the tenth transistor 404 may be substantially the same as the voltage Vgsn between the gate and source of the tenth transistor 404. Since a negative input terminal of the first operational amplifier 402 is coupled to the source of the ninth transistor 403, the negative input terminal receives a voltage of −Vgsp+Vgsn as the input. A positive input terminal of the first operational amplifier 402 is coupled to the first potential node VDD. The first operational amplifier 402 controls the gate voltage of the p-channel transistor 405 such that a voltage which is substantially the same voltage as the voltage −Vgsp+Vgsn between the source of the ninth transistor 403 and the source of the tenth transistor 404 is output to the first potential node VDD. The source of the p-channel transistor 405 is coupled to the potential node VDD1, the gate of the p-channel transistor 405 is coupled to the output terminal of the first operational amplifier 402, and the drain of the p-channel transistor 405 is coupled to the first potential node VDD. Therefore, the potential Vdd of the first potential node VDD is set to Vgsp+Vgsn.

The voltage between the gate and source of each of the p-channel transistors 403, 111, 112, 121 and 131 may be substantially equivalent to the Vgsp. The voltage between the gate and source of each of the n-channel transistors 404, 113, 114, 122 and 132 may be substantially equivalent to the Vgsn. The potential Vdd of the first potential node VDD may be substantially the same as the potential −Vgsp+Vgsn obtained by adding the voltage Vgsp between the gate and source of the first transistor 111 and the voltage Vgsn between the gate and source of the third transistor 113.

The common mode voltage of the differential signals input to the differential input nodes INP and INM may be set to Vdd+Vgsp=(−Vgsp+Vgsn)+Vgsp=Vgsn.

The voltage between the drain and source of each of the p-channel transistors 403, 111, 112, 121 and 131 may be substantially the same as the voltage Vgsp between the gate and source of each of the p-channel transistors 403, 111, 112, 121 and 131. The voltage between the drain and source of each of the n-channel transistors 404, 113, 114, 122 and 132 may be substantially the same as the voltage Vgsn between the gate and source of each of the n-channel transistors 404, 113, 114, 122 and 132. Therefore, an effect of DC drain current deviation caused by the resistors between the drain and source of the transistor may be reduced. Therefore, the common mode voltage of the differential input signal and the common mode voltage of the differential output signal may become substantially the same and thus, the differential signals having a stabilized common mode voltage may be output.

A reference voltage −Vgsp+Vgsn generated by flowing a current to a series coupled circuit with a p-channel transistor 403 and an n-channel transistor 404 coupled in series is used to generate a potential Vdd of a first potential node VDD. Therefore, noise intrusion into the signal from an external power supply may be reduced.

Figure 5:
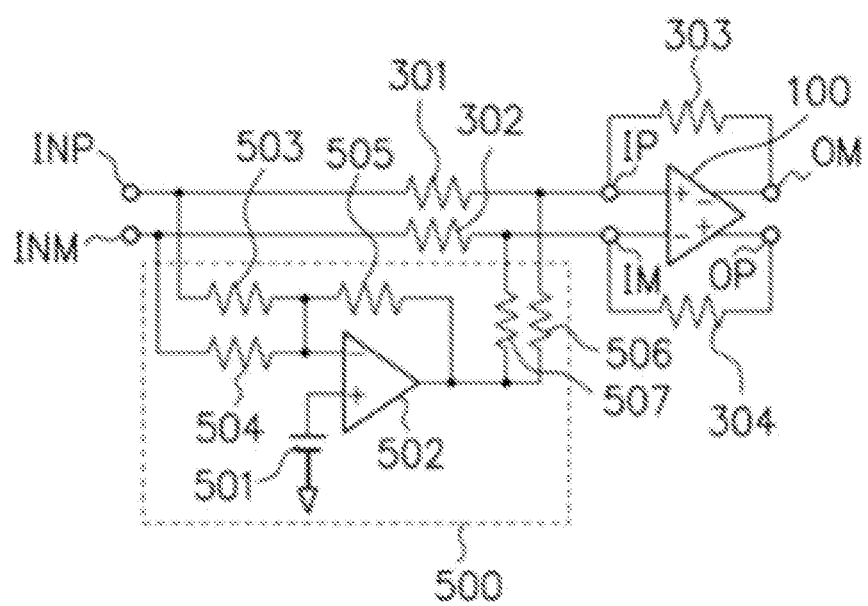
FIG. 5 is a circuit diagram illustrating yet another example of a differential amplification circuit.

FIG. 5 illustrates an example of another differential amplification circuit. Descriptions will be made on a difference between the differential amplification circuit illustrated in FIG. 5 and the differential amplification circuit illustrated in FIGS. 2A and 2B, and descriptions on the matters that are substantially the same or similar between the differential amplification circuits illustrated in FIG. 5 and FIGS. 2A and 2B may be omitted or reduced. In the differential amplification circuit of FIG. 5, an offset elimination circuit 500 is added to the differential amplification circuit of FIG. 3B.

The common mode voltage Vdd+Vgsp of differential signals input to the differential input nodes INP and INM in FIGS. 2A and 2B may include an offset voltage Vf and the common mode voltage of differential signals inputted to the differential input nodes INP and INM may become Vdd+Vgsp+Vf. The offset elimination circuit 500 receives the differential signals having the common mode voltage of Vdd+Vgsp+Vf from the differential input nodes INP and INM as inputs, eliminates the offset voltage Vf, and outputs the differential signal having the common mode voltage of Vdd+Vgsp to the differential input nodes IP and IM.

The offset elimination circuit 500 includes a voltage reference 501, an operational amplifier 502 and resistors 503 to 507. The voltage reference 501 outputs a reference voltage Vdd+Vgsp. A positive input terminal of the second operational amplifier 502 is coupled to a node having the reference voltage Vdd+Vgsp of a DC power supply 501. A seventh resistor 503 is coupled between the third differential input node INP and a negative input terminal of the second operational amplifier 502. An eighth resistor 504 is coupled between the fourth differential input node INM and the negative input terminal of the second operational amplifier 502. A ninth resistor 505 is coupled between the negative input terminal of the second operational amplifier 502 and the output terminal of the second operational amplifier 502. A tenth resistor 506 is coupled between the output terminal of the second operational amplifier 502 and the first differential input node IP. An eleventh resistor 507 is coupled between the output terminal of the second operational amplifier 502 and the second differential input node IM.

For example, in a case where the resistors 503, 504, 505, 506 and 507 are suitably set, the common mode voltage of the differential signals of the differential input nodes INP and INM may be Vdd+Vgsp+Vf. The output voltage of the second operational amplifier 502 is Vdd+Vgsp−Vf. Therefore, since the common mode voltage of the differential signals of the differential input nodes IP and IM becomes an average voltage of the common mode voltage Vdd+Vgsp+Vf of the differential signals of differential input nodes INP and INM and the output voltage Vdd−Vgsp−Vf of the second operational amplifier 502, the common mode voltage of the differential signals of the differential input nodes IP and IM becomes Vdd+Vgsp and the offset voltage Vf is eliminated. For example, the values of resistors 503, 504, 505, 506, and 507 may be set in such a way that the value of the resistors 503 and 504 are set to be equal to R1, the value of the resistor 505 is set to be equal to R1/2, and the values of the resistors 506, 507, 301 and 302 are set to be equal with each other.

When the common mode voltage of the third differential input node INP and the fourth differential input node INM has the offset voltage Vf with respect to the reference voltage Vdd+Vgsp, the offset elimination circuit 500 outputs the common mode voltage having the magnitude of the reference voltage Vdd+Vgsp that the offset voltage Vf is eliminated to the first differential input node IP and the second differential input node IM. For example, the offset elimination circuit 500 may output the current which cancels the offset voltage Vf to the first differential input node IP and the second differential input node IM.

Figure 6B:
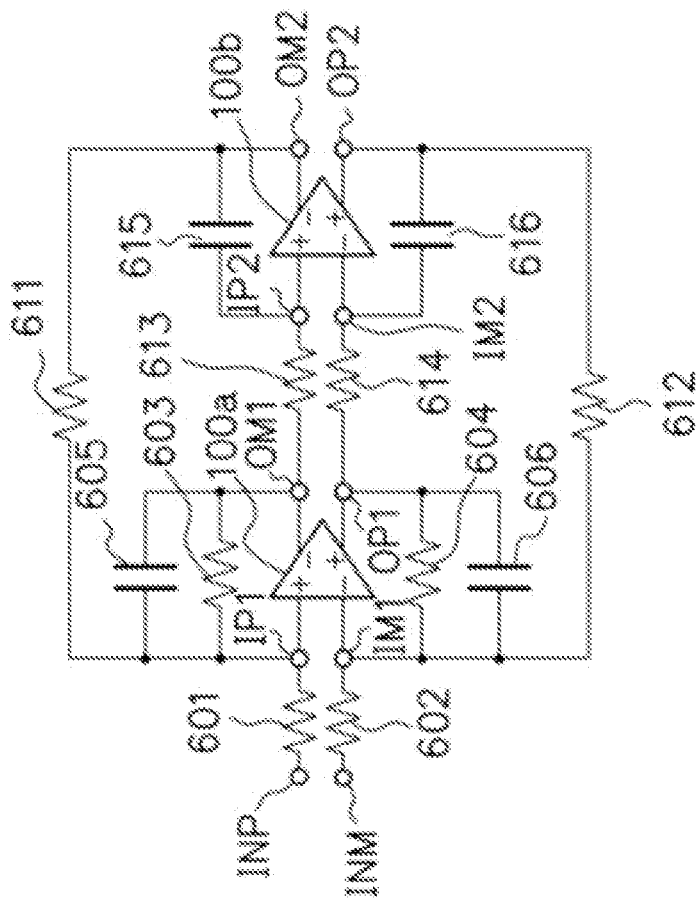
FIGS. 6A and 6B are circuit diagrams each illustrating an example of a low pass filter.
Figure 6A:
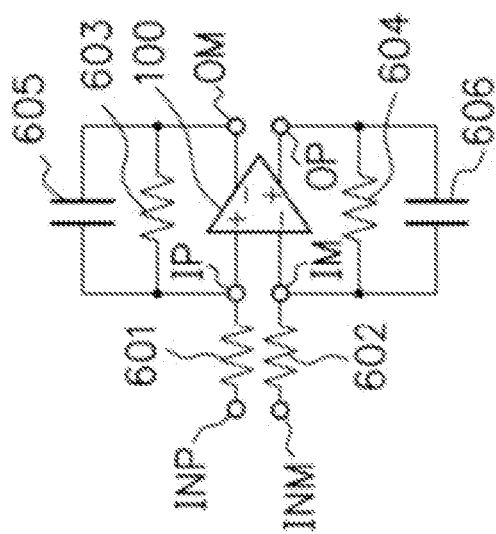

FIGS. 6A and 6B illustrate examples of low pass filters. FIG. 6A illustrates an exemplary configuration of a primary low pass filter. In FIG. 6A, the primary low pass filter may be configured by using the differential amplification circuit 100 illustrated in FIGS. 1A and 1B, FIGS. 3A and 3B, FIG. 4 or FIG. 5. A fifth resistor 601 is coupled between the first differential input node IP and the third differential input node INP. A sixth resistor 602 is coupled between the second differential input node IM and the fourth differential input node INM. A parallel coupled circuit with a resistor 603 and capacitor 605 connected in parallel is a first feedback element, and is coupled between the first differential input node IP and the second differential output node OM. A parallel coupled circuit with a resistor 604 and capacitor 606 coupled in parallel is a second feedback element, and is coupled between the second differential input node IM and the first differential output node OP.

FIG. 6B illustrates an exemplary configuration of a secondary low pass filter. In FIG. 6B, the secondary low pass filter may be configured by using two differential amplification circuits 100a and 100b.

The differential amplification circuit 100a may have a configuration which is substantially the same as that of the differential amplification circuit 100 illustrated in FIGS. 1A and 1B, FIGS. 3A and 3B, FIG. 4 or FIG. 5. A first differential input node IP1 may correspond to the first differential input node IP illustrated in FIGS. 1A and 1B, FIGS. 3A and 3B, FIG. 4 or FIG. 5. A second differential input node IM1 may correspond to the second differential input node IM illustrated in FIGS. 1A and 1B, FIGS. 3A and 3B, FIG. 4 or FIG. 5. A first differential output node OP1 may correspond to the first differential output node OP illustrated in FIGS. 1A and 1B, FIGS. 3A and 3B, FIG. 4 or FIG. 5. A second differential output node OM1 may correspond to the second differential output node OM illustrated in FIGS. 1A and 1B, FIGS. 3A and 3B, FIG. 4 or FIG. 5.

The differential amplification circuit 100b may have a configuration which is substantially the same as the differential amplification circuit 100 illustrated in FIGS. 1A and 1B, FIGS. 3A and 3B, FIG. 4 or FIG. 5. A first differential input node IP2 may correspond to the first differential input node IP illustrated in FIGS. 1A and 1B, FIGS. 3A and 3B, FIG. 4 or FIG. 5. A second differential input node IM2 may correspond to the second differential input node IM illustrated in FIGS. 1A and 1B, FIGS. 3A and 3B, FIG. 4 or FIG. 5. A first differential output node OP2 may correspond to the first differential output node OP illustrated in FIGS. 1A and 1B, FIGS. 3A and 3B, FIG. 4 or FIG. 5. A second differential output node OM2 may correspond to the second differential output node OM illustrated in FIGS. 1A and 1B, FIGS. 3A and 3B, FIG. 4 or FIG. 5.

The fifth resistor 601 is coupled between the first differential input node IP1 and the third differential input node INP. The sixth resistor 602 is coupled between the second differential input node IM1 and the fourth differential input node INM. A parallel coupled circuit with the resistor 603 and capacitor 605 coupled in parallel is the first feedback element, and is coupled between the first differential input node IP1 and the second differential output node OM1. A parallel coupled circuit with the resistor 604 and capacitor 606 coupled in parallel is the second feedback element and is coupled between the second differential input node IM1 and the first differential output node OP1.

A fifth resistor 613 is coupled between the first differential input node IP2 and the second differential output node OM1. A sixth resistor 614 is coupled between the second differential input node IM2 and the first differential output node OP1. A capacitor 615 is the first feedback element and is coupled between the first differential input node IP2 and the second differential output node OM2. A capacitor 616 is the second feedback element and is coupled between the second differential input node IM2 and the first differential output node OP2. A resistor 611 is coupled between the differential input node IP1 and differential output node OM2. A resistor 612 is coupled between the differential input node IM1 and differential output node OP2.

The first transistor 111 and the third transistor 113 are coupled between the first potential node VDD and the second potential node GND in the differential amplification circuit illustrated in FIGS. 1A and 1B, FIGS. 3A and 3B, FIG. 4 or FIG. 5. Therefore, an operation is performed at a lower power supply voltage and thus, a power consumption may be reduced. Since the common mode voltage of the differential signals is converged without using the common-mode feedback circuit 202, an area occupied by the differential amplification circuit may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A differential amplification circuit comprising:
   a first differential input node;
   a second differential input node;
   a first differential output node;
   a second differential output node;
   a first transistor having a gate coupled to the first differential input node and a source coupled to a first potential node;
   a second transistor having a gate coupled to the second differential input node and a source coupled to the first potential node;
   a third transistor having a drain coupled to a drain of the first transistor and a source coupled to a second potential node;
   a fourth transistor having a gate coupled to a gate of the third transistor, a drain coupled to a drain of the second transistor, and a source coupled to the second potential node;
   a first resistor coupled between the drain and gate of the third transistor;
   a second resistor coupled between the drain and the gate of the fourth transistor;
   a fifth transistor having a gate coupled to the drain of the first transistor, a source coupled to the second potential node, and a drain coupled to the first differential output node;
   a sixth transistor having a gate coupled to the drain of the second transistor, a source coupled to the second potential node, and a drain coupled to the second differential output node;
   a seventh transistor having a source coupled to the first potential node and a drain coupled to the first differential output node;
   an eighth transistor having a gate coupled to a gate of the seventh transistor, a source coupled to the first potential node, and a drain coupled to the second differential output node;
   a third resistor coupled between the drain and gate of the seventh transistor; and
   a fourth resistor coupled between the drain and gate of the eighth transistor.

2. The differential amplification circuit according to claim 1, wherein a common mode voltage of differential signals input to the first differential input node and the second differential input node is set to be substantially the same as the voltage between the gates and the drains of the first transistor and the second transistor.

3. The differential amplification circuit according to claim 1, wherein a potential of the first potential node is set to be substantially the same as a potential obtained by adding a voltage between the gate and the source of the first transistor and a voltage between the gate and the source of the third transistor.

4. The differential amplification circuit according to claim 1, further comprising:
   a ninth transistor having a gate and a drain coupled to each other;
   a tenth transistor having a gate and a drain coupled to the drain of the ninth transistor; and
   a first voltage regulator configured to output a voltage which is substantially the same as a voltage between a source of the ninth transistor and a source of the tenth transistor.

5. The differential amplification circuit according to claim 1, further comprising:
   a fifth resistor coupled to the first differential input node;
   a sixth resistor coupled to the second differential input node;
   a first feedback element coupled between the first differential input node and the second differential output node; and
   a second feedback element coupled between the second differential input node and the first differential output node.

6. The differential amplification circuit according to claim 5, wherein each of the first feedback element and the second feedback element is a resistor.

7. The differential amplification circuit according to claim 5, wherein each of the first feedback element and the second feedback element is a parallel coupled circuit with a resistor and a capacitor which are coupled in parallel.

8. The differential amplification circuit according to claim 5, wherein each of the first feedback element and the second feedback element is a capacitor.

9. The differential amplification circuit according to claim 5, wherein the fifth resistor is coupled between the first differential input node and a third differential input node, the sixth resistor is coupled between the second differential input node and a fourth differential input node, and further comprising an offset elimination circuit configured to output current which cancels an offset voltage to the first differential input node and the second differential input node in a case where the common mode voltage of the third differential input node and the fourth differential input node has the offset voltage with respect to a reference voltage.

10. The differential amplification circuit according to claim 9, wherein the offset elimination circuit includes an operational amplifier having a positive input terminal connected to a node of the reference voltage, a seventh resistor coupled between the third differential input node and a negative input terminal of the second operational amplifier, an eighth resistor coupled between the fourth differential input node and the negative input terminal of the operational amplifier, a ninth resistor coupled between the negative input terminal of the second operational amplifier and an output terminal of the operational amplifier, a tenth resistor coupled between the output terminal of the operational amplifier and the first differential input node, and an eleventh coupled between the output terminal of the operational amplifier and the second differential input node.

11. The differential amplification circuit according to claim 1, further comprising:
   a first phase compensation circuit coupled between the drain and the gate of the fifth transistor; and
   a second phase compensation circuit coupled between the drain and the gate of the sixth transistor.

* * * * *